United States Patent
Sun

(10) Patent No.: US 9,111,944 B2
(45) Date of Patent: Aug. 18, 2015

(54) METHOD OF FABRICATING A FERROELECTRIC CAPACITOR

(71) Applicant: Cypress Semiconductor Corporation, San Jose, CA (US)

(72) Inventor: Shan Sun, Monument, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/222,904

(22) Filed: Mar. 24, 2014

(65) Prior Publication Data

US 2015/0072441 A1     Mar. 12, 2015

Related U.S. Application Data

(60) Provisional application No. 61/875,190, filed on Sep. 9, 2013.

(51) Int. Cl.
*H01L 49/02* (2006.01)
*H01L 27/115* (2006.01)

(52) U.S. Cl.
CPC .......... *H01L 28/55* (2013.01); *H01L 27/11502* (2013.01)

(58) Field of Classification Search
None
See application file for complete search history.

(56) References Cited

U.S. PATENT DOCUMENTS

| | | |
|---|---|---|
| 6,274,424 B1 | 8/2001 | White, Jr. et al. |
| 6,423,592 B1 | 7/2002 | Sun |
| 6,876,021 B2 | 4/2005 | Martin et al. |
| 7,029,925 B2 | 4/2006 | Celii et al. |
| 7,442,982 B2 | 10/2008 | Won et al. |
| 7,985,603 B2 | 7/2011 | Celii et al. |
| 8,093,070 B2 | 1/2012 | Celii et al. |
| 8,367,541 B2 | 2/2013 | Nagai et al. |
| 2001/0034106 A1 | 10/2001 | Moise et al. |
| 2003/0006439 A1* | 1/2003 | Bailey ........................ 257/295 |
| 2003/0129771 A1 | 7/2003 | Summerfelt et al. |
| 2004/0046198 A1 | 3/2004 | Joshi et al. |
| 2005/0012126 A1* | 1/2005 | Udayakumar et al. ........ 257/295 |
| 2005/0054122 A1 | 3/2005 | Celii et al. |
| 2006/0267057 A1* | 11/2006 | Hayashi ....................... 257/295 |
| 2009/0302362 A1* | 12/2009 | Kikuchi et al. ............... 257/295 |
| 2011/0140238 A1* | 6/2011 | Natori et al. .................. 257/532 |

OTHER PUBLICATIONS

Applications and issues for ferroelectric NVMs, http://www.sciencedirect.com/science/article/pii/S1369800102001002, captured-printed Jan. 31, 2014.

(Continued)

*Primary Examiner* — Khaja Ahmad

(57) ABSTRACT

Ferroelectric capacitors used in ferroelectric random access memories (F-RAM) and methods for fabricating the same to reduce sidewall leakage are described. In one embodiment, the method includes depositing over a surface of a substrate, a ferro stack including a bottom electrode layer electrically coupled to a bottom electrode contact extending through the substrate, a top electrode layer and ferroelectric layer there between. A hard-mask is formed over the ferro stack, and a top electrode formed by etching through the top electrode layer and at least partially through the ferroelectric layer. A non-conductive barrier is formed on sidewalls formed by etching through the top electrode layer and at least partially through the ferroelectric layer, and then a bottom electrode is formed by etching the bottom electrode layer so that conductive residues generated by the etching are electrically isolated from the top electrode by the non-conductive barrier.

9 Claims, 10 Drawing Sheets

(56) References Cited

OTHER PUBLICATIONS

A study of thermo-mechanical stress and its impact on through-silicon vias, http://iopscience.iop.org/0960-1317/18/7/075018, captured-printed Jan. 31, 2014.

Three dimensional (BA, SR) TIO3 stack capacitors for dram application, http://www.tandfonline.com/doi/abs/10.1080/10584580108016939#.UzHD6YUILnh, captured-printed Jan. 31, 2014.

International Search Report for International Application No. PCT/US14/51200 dated Nov. 13, 2014; 2 pages.

Written Opinion of the International Searching Authority for International Application No. PCT/US2014/051200 mailed Nov. 13, 2014; 5 pages.

* cited by examiner

9,111,944 B2

METHOD OF FABRICATING A FERROELECTRIC CAPACITOR

CROSS-REFERENCE TO RELATED APPLICATIONS

This application claims the benefit of priority under 35 U.S.C. 119(e) to U.S. Provisional Patent Application Ser. No. 61/875,190, filed Sep. 9, 2013 which is incorporated by reference herein.

TECHNICAL FIELD

The present disclosure relates generally to semiconductor devices, and more particularly to ferroelectric capacitors in ferroelectric random access memories (F-RAM) and methods for fabricating the same to reduce sidewall leakage.

BACKGROUND

A ferroelectric capacitor for use in a ferroelectric random access memories (F-RAM) cell is shown in FIG. 1. Referring to FIG. 1 the ferroelectric capacitor 100 typically includes a ferroelectric material 102, such as lead zirconate titanate (PZT) between an upper or top electrode 104 and a lower or bottom electrode 106. The top electrode 104 is electrically coupled to a first contact 108 through a conductive hard-mask layer 110 used in forming the capacitor 100, and the bottom electrode 106 is electrically coupled to a second contact 112 through a conductive oxygen ($O_2$) barrier 114 on a surface of a substrate 116. Generally, sidewalls 118 of the ferroelectric capacitor 100 are encapsulated by a dielectric layer 120 that serves as a barrier to substantially prevent diffusion of hydrogen ($H_2$) into and lead (Pb) diffusing out from the ferroelectric capacitor during subsequent processing steps of the F-RAM, which could detrimentally impact operation of the ferroelectric capacitor.

One problem with conventional ferroelectric capacitors 100 and methods of forming the same is a conductive residue 122 re-deposited on the sidewalls 118 of the ferroelectric capacitor 100 during etching of layers forming the bottom electrode 106 and conductive $O_2$ barrier 114. The conventional approach to removing this conductive residue 122 typically involves one or more complicated dry and/or wet cleans each including one or more steps. These cleans are aggressive potentially damaging other features or elements in the F-RAM integrally formed on a common substrate with the ferroelectric capacitor 100, decreasing a yield of working devices and increasing fabrication time and costs. More fundamentally, as illustrated by the ferroelectric capacitor 100 in FIG. 1, these conventional cleans are not wholly effective in removing the conductive residue 122, leaving some conductive residues on the sidewalls 118 and forming a high leakage path between bottom electrode 106 and top electrode 104 impairing operation of the ferroelectric capacitor 100, or, when the remaining conductive residues are excessive, shorting the bottom electrode and top electrode rendering the ferroelectric capacitor completely inoperative.

SUMMARY

Ferroelectric random access memories (F-RAM) including ferroelectric capacitors with a non-conductive barrier covering sidewalls of a top electrode and at least partially covering sidewalls of a ferroelectric and methods of forming the same are provided. The non-conductive barrier and methods of the present disclosure minimizes sidewall leakage and damage to the ferroelectric, lowering defect density and increasing yield of F-RAMs.

In one embodiment, the method includes depositing a ferro stack over a surface of a substrate, the ferro stack including a bottom electrode layer electrically coupled to a bottom electrode contact extending through the substrate, a top electrode layer and ferroelectric layer there between. Next, a conductive hard-mask is formed over the ferro stack, and the ferro stack etched to form a ferroelectric capacitor. Forming the ferroelectric capacitor includes: (i) etching through the top electrode layer and at least partially through the ferroelectric layer to form a top electrode; (ii) forming a non-conductive barrier on sidewalls of the ferroelectric capacitor formed by etching through the top electrode layer and at least partially through the ferroelectric layer; and (v) forming a bottom electrode, wherein forming the bottom electrode comprises etching the bottom electrode layer, and wherein conductive residues generated by the etching are electrically isolated from the top electrode by the non-conductive barrier.

In some embodiments, forming the bottom electrode includes concurrently thinning non-conductive barrier while etching the bottom electrode layer. The thinning of the non-conductive barrier can include substantially removing the non-conductive barrier from a top surface of the conductive hard-mask.

Generally, the bottom electrode layer is etched with an etch chemistry highly selective to a material of the non-conductive barrier. The material of the non-conductive barrier can include aluminum oxide ($Al_2O_3$), silicon nitride (SiN), silicon oxynitride (SiON), silicon oxide ($SiO_2$) or lead zirconate titanate (PZT). Other embodiments are also disclosed.

BRIEF DESCRIPTION OF THE DRAWINGS

The present invention will be understood more fully from the detailed description that follows and from the accompanying drawings and the appended claims provided below, where:

DETAILED DESCRIPTION

Embodiments of ferroelectric random access memories (F-RAM) including ferroelectric capacitors formed by patterning a stack of layers on a surface of a substrate and methods of fabricating the same to reduce or eliminate sidewall leakage are described herein with reference to figures. However, particular embodiments may be practiced without one or more of these specific details, or in combination with other known methods, materials, and apparatuses. In the following description, numerous specific details are set forth, such as specific materials, dimensions and processes parameters etc. to provide a thorough understanding of the present invention. In other instances, well-known semiconductor design and fabrication techniques have not been described in particular detail to avoid unnecessarily obscuring the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

The terms "over," "under," "between," and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

Figure 1:
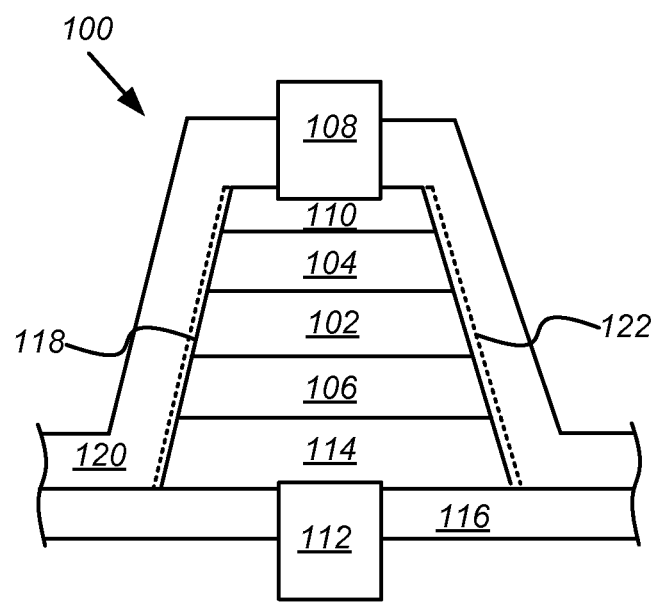
FIG. 1 (Related Art) is a block diagram illustrating a cross-sectional view of a ferroelectric capacitor fabricated according to conventional method and exhibiting conductive residue forming a leaky path on a sidewall thereof.
Figure 2:
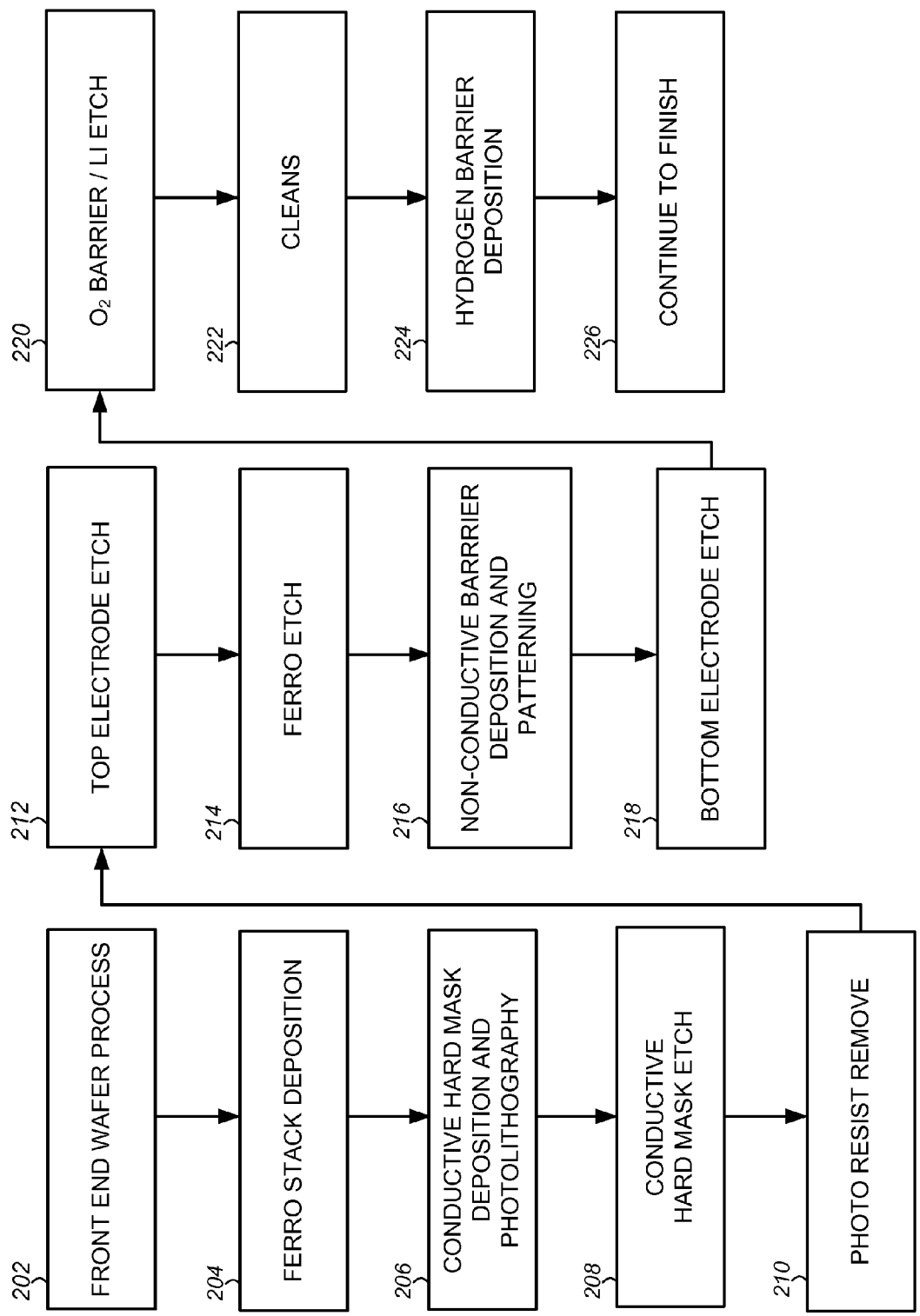
FIG. 2 is a flowchart illustrating an embodiment of a method for fabricating a ferroelectric capacitor in a ferroelectric random access memory (F-RAM) to reduce sidewall leakage.

An embodiment of a method for fabricating a ferroelectric capacitor including a non-conductive barrier covering sidewalls of a top electrode and at least partially covering sidewalls of a ferroelectric of the capacitor to minimize sidewall leakage and damage to the ferroelectric will now be described in detail with reference to FIG. 2 and FIGS. 3A through 3J. FIG. 2 is a flowchart illustrating an embodiment of a method for fabricating a ferroelectric random access memory (F-RAM) including such a ferroelectric capacitor. FIGS. 3A-3I are block diagrams illustrating cross-sectional views of a portion of an F-RAM cell during fabrication thereof according to the method of FIG. 2. FIG. 3J is a block diagrams illustrating a cross-sectional view of a portion of a completed F-RAM cell fabricated according to the method of FIG. 2.

Figure 3A:
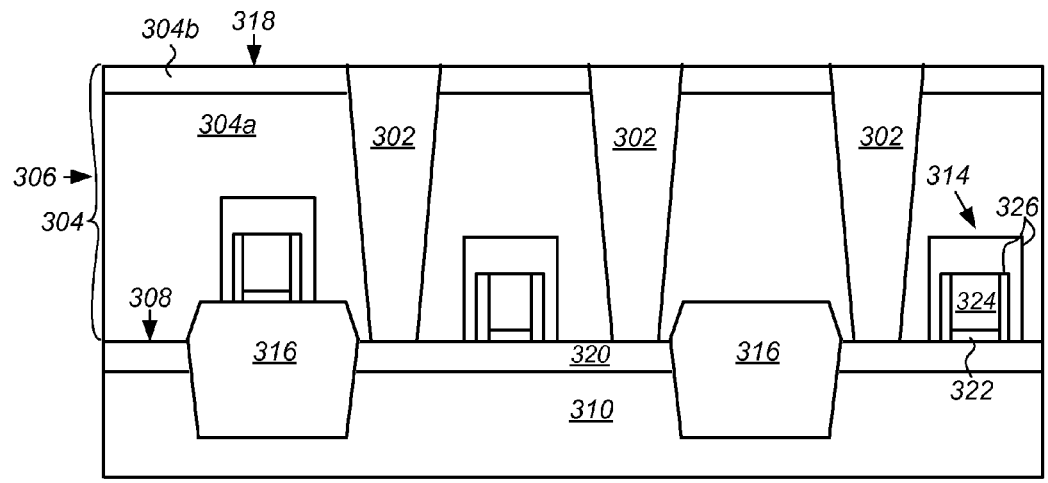
FIGS. 3A-3I are block diagrams illustrating cross-sectional views of ferroelectric capacitors in a portion of an F-RAM cell during fabrication thereof according to the method of FIG. 2.

Referring to FIG. 2 and FIG. 3A, the method begins in a front end wafer process (block 202) with planarizing surfaces of bottom electrode contacts or first contacts 302 and an inter-metal dielectric or first dielectric layer 304 after formation of a gate level 306 on a surface 308 of a substrate 310, the gate level including gate stacks of one or more metal-oxide-semiconductor (MOS) transistors 314, separated by one or more isolation structures 316 the first dielectric layer overlying the MOS transistors and the first contacts extending through the first dielectric layer from a top surface 318 thereof to a diffusion region 320, such as a source or a drain, in the MOS transistor in the substrate.

In addition to a source and a drain, diffusion regions 320 can include a channel region (not shown in this figure). Generally, the substrate 310 and, hence, diffusion regions 320, may be composed of any material suitable for semiconductor device fabrication. In one embodiment, the substrate 310 is a bulk substrate composed of a single crystal of a material which may include, but is not limited to, silicon, germanium, silicon-germanium or an III-V compound semiconductor material. In another embodiment, the substrate 310 includes a bulk layer with a top epitaxial layer. In a specific embodiment, the bulk layer is composed of a single crystal of a material which may include, but is not limited to, silicon, germanium, silicon-germanium, a III-V compound semiconductor material and quartz, while the top epitaxial layer is composed of a single crystal layer which may include, but is not limited to, silicon, germanium, silicon-germanium and a III-V compound semiconductor material. The top epitaxial layer is composed of a single crystal layer which may include, but is not limited to, silicon (i.e. to form a silicon-on-insulator (SOI) semiconductor substrate), germanium, silicon-germanium and an III-V compound semiconductor material. The insulator layer is composed of a material which may include, but is not limited to, silicon dioxide, silicon nitride and silicon oxy-nitride. The lower bulk layer is composed of a single crystal which may include, but is not limited to, silicon, germanium, silicon-germanium, an III-V compound semiconductor material and quartz.

The substrate 310 and, hence, the channel region, may include dopant impurity atoms. In a specific embodiment, channel region is doped P-type and, in an alternative embodiment, channel region is doped N-type. Source and drain diffusion regions 320 in the substrate 310 have opposite conductivity to channel region. For example, in one embodiment the substrate 310 and, hence, channel region, is composed of boron-doped single-crystal silicon having a boron concentration in the range of $1 \times 10^{15}$-$1 \times 10^{19}$ atoms/cm$^3$. Source and drain diffusion regions 320 are composed of phosphorous- or arsenic-doped regions having a concentration of N-type dopants in the range of $5 \times 10^{16}$-$5 \times 10^{19}$ atoms/cm$^3$. Generally, source and drain diffusion regions 320 have a depth in the substrate 310 in the range of 80-200 nanometers (nm). In accordance with an alternative embodiment of the present disclosure, source and drain diffusion regions 320 are P-type doped regions while the substrate 310 and channel region is an N-type doped region.

The gate stacks 312 can include a gate oxide 322 formed on the surface 308 of the substrate 310, a gate layer 324 formed on gate oxide, and one or more sidewall spacers 326 isolating the gate layer from the first dielectric layer 304. Additionally, although not shown in this figure it will be understood by those skilled in the art that the gate layer 324 is generally electrically coupled to an overlying local interconnect (LI) or a metallization layer, such as a first metallization (M1) layer described in more detail below.

The first dielectric layer 304 can include a single layer of dielectric material or multiple layers of dielectric material as in the embodiment shown. For example, in one embodiment the first dielectric layer 304 includes a lower or bottom first dielectric layer 304a including phosphosilicate glass (PSG) formed or deposited by a chemical vapor deposition (CVD) process, such as plasma, low pressure or atmospheric CVD, and an upper or top first dielectric layer 304b including a silicon oxide, deposited by low pressure CVD (LPCVD) tool using tetraethyl-orthosilicate (TEOS) based process gas or precursors.

The first contacts 302 are formed by performing a contact etch to etch the first dielectric layer 304 exposing the underlying diffusion regions 320 followed by filling the openings formed with a conductive material, typically a refractory metal. The contact etch can be accomplished using standard photolithographic techniques and any suitable wet or dry etching chemistry for etching a silicon oxide and/or PSG. Suitable contact etch chemistries can include, for example, wet etching using hydrofluoric acid (HF), or gas phase etching (GPE) using a reactive ion etch (RIE) process gas including HF and methanol or methyl alcohol ($CH_3OH$). Contact openings formed in the first dielectric layer 304 are filled with a refractory metal. By refractory metals it is meant metals of elements of the groups 4, 5 and 6 of the periodic table, including titanium (Ti), tantalum (Ta), tungsten (W), and nitrides or alloys thereof, which are resistant to high temperatures. The refractory metal can be deposited, for example, by physical vapor deposition, such as sputtering or evaporation, or by CVD and electroless plating.

As noted above, once formed the surfaces of the first contacts 302 and first dielectric layer 304 are planarized, for example, using a chemical mechanical polishing (CMP) process.

Figure 3B:
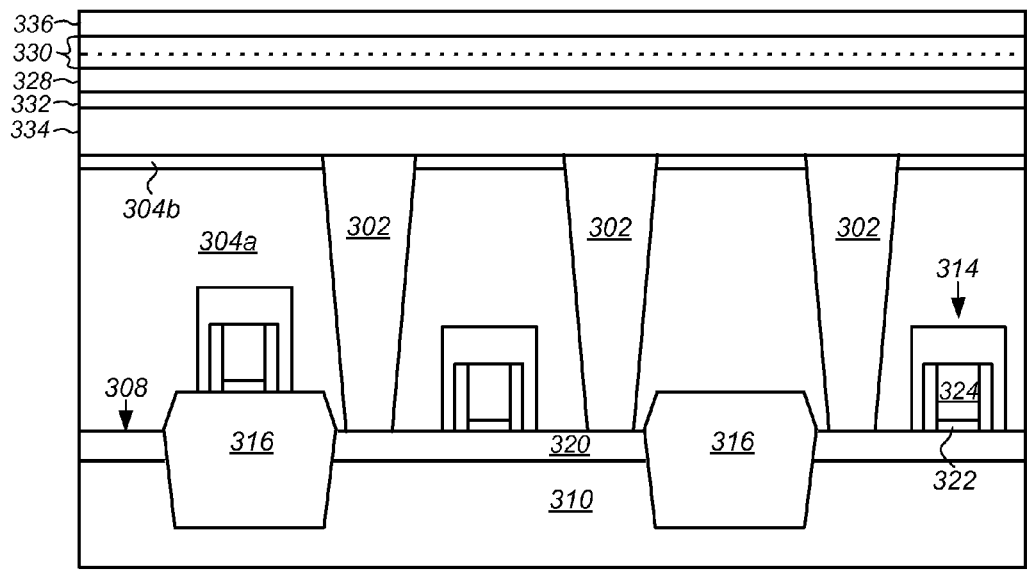

Next, referring to FIG. 2 and FIG. 3B layers of a ferro stack from which a ferroelectric capacitor will be formed are deposited or formed over the planarized surfaces of the first contacts 302 and first dielectric layer 304 (block 204). Generally, the ferro stack layers includes a layer of a ferroelectric material, such as a lead zirconate titanate (PZT) ferroelectric layer 328, between a top electrode layer 330 and bottom electrode layer 332 in electrical contact with or electrically coupled to one of the underlying first contacts 302. In some embodiment, such as that shown, the ferro stack can further include an oxygen ($O_2$) barrier layer 334. The $O_2$ barrier layer 334 can include a layer of titanium aluminum nitride (TiAlN), titanium aluminum oxynitride (TiAlON) or a combination of the two having a thickness of from about 0.03 to about 0.10 µm, and is deposited or formed using any suitable deposition method, such as CVD, atomic layer deposition (ALD), or physical vapor deposition (PVD). The top and the bottom electrode layers 330, 332, can include one or more layers of iridium or iridium oxide having a thickness of from about 0.05 to about 0.20 µm, and deposited or formed using CVD, ALD or PVD. In the embodiment shown the top electrode layer 330 is a multi-layer top electrode including, for example, a lower layer of iridium oxide ($IrO_2$) in contact with the PZT ferroelectric layer 328 and an upper layer of iridium (Ir) overlying the lower layer of the top electrode. The PZT ferroelectric layer 328 is deposited on the bottom electrode layer 332 to a thickness of from about 0.04 to about 0.20 µm, using CVD, ALD or PVD.

Figure 3C:
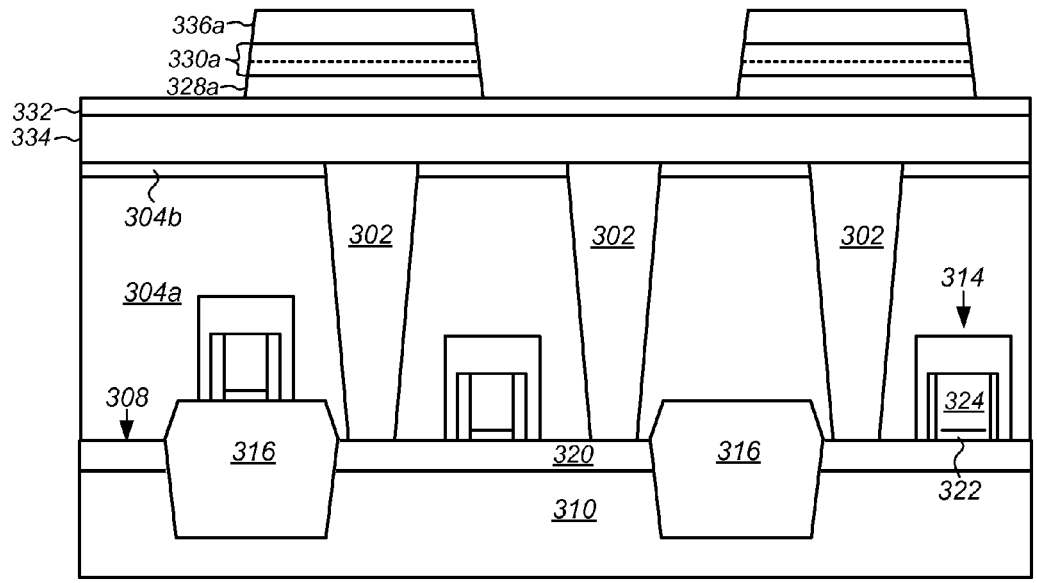

Referring to FIG. 2 and to FIG. 3B a conductive hard-mask layer 336 is deposited or formed over the ferro stack layers 328-334 and a patterned photoresist (PR) mask (not shown) formed over the conductive hard-mask layer using standard photolithographic techniques (block 206), and the conductive hard-mask layer is etched (block 208) to form the conductive hard-mask 336a shown in FIG. 3C. In certain embodiments, the conductive hard-mask 336a can include multiple layers, one or more of which are left on a top electrode 330a of a ferroelectric capacitor after forming the ferroelectric capacitor. In these embodiments, the material of the conductive hard-mask 336a is selected to electrically couple a top electrode contact or second contact (not shown in this figure) to the top electrode 330a and form a hydrogen ($H_2$) barrier. The conductive hard-mask 336a can include, for example, a layer of titanium aluminum nitride (TiAlN) having a thickness of from about 0.15 to about 0.20 µm, and deposited or formed using a PVD process. Suitable chemistries and techniques for etching the conductive hard-mask 336a can include standard metal etch chemistries.

Next, referring again to FIG. 2 and FIG. 3C any photoresist (not shown) remaining on the conductive hard-mask 336a after the conductive hard-mask etch is removed (block 210), the top electrode layer 330 is etched (block 212) to form the top electrode 330a of a ferroelectric capacitor, and the ferroelectric layer 328 is at least partially etched (block 214). Generally, the top electrode layer 330 exposed between the conductive hard-mask 336a is etched through or removed completely by the top electrode etch. Suitable chemistries and techniques for etching the top electrode layer 330 can include standard metal etch chemistries using wet or dry etching techniques.

In some embodiments, such as shown in FIG. 3C, portions of the ferroelectric layer 328 exposed between the conductive hard-mask 336a are also removed completely by the ferroelectric etch stopping on the bottom electrode layer 332 to the ferroelectric 328a of a ferroelectric capacitor. To accomplish this, etching of the top electrode layer 330 and the ferroelectric layer 328 are performed in separate etch processes, and the etch chemistry used to etch the ferroelectric layer is highly selective to materials of the bottom electrode layer 332. Suitable chemistries and techniques for etching the ferroelectric layer 328 can include standard oxide etch chemistries, in contrast to standard metal etch chemistries that are used to etch the bottom electrode layer 332 and $O_2$ barrier layer 334.

Figure 3D:
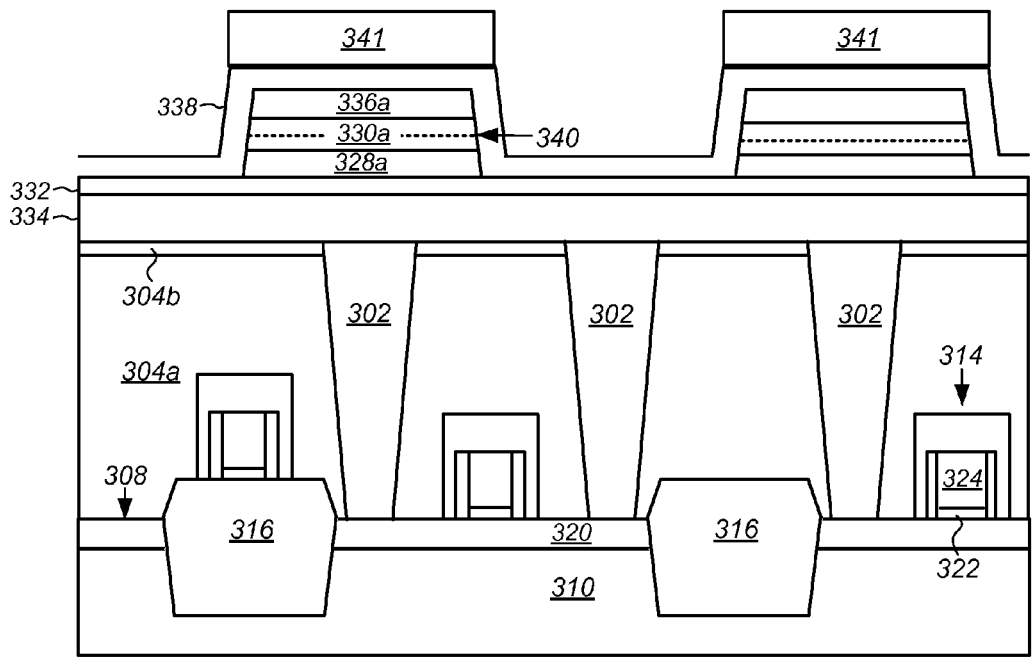
Figure 3E:
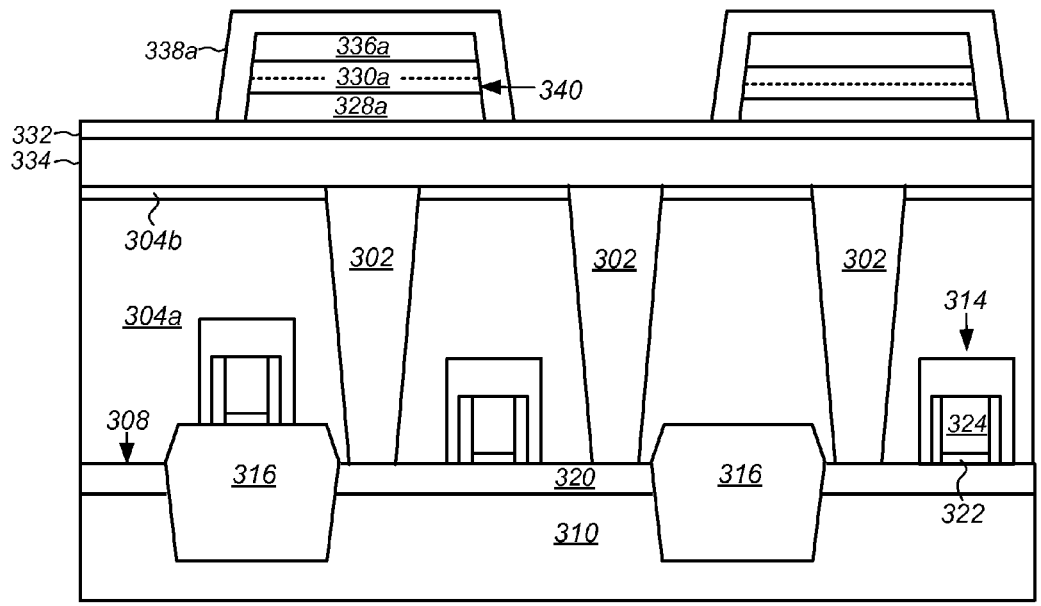
Figure 3F:
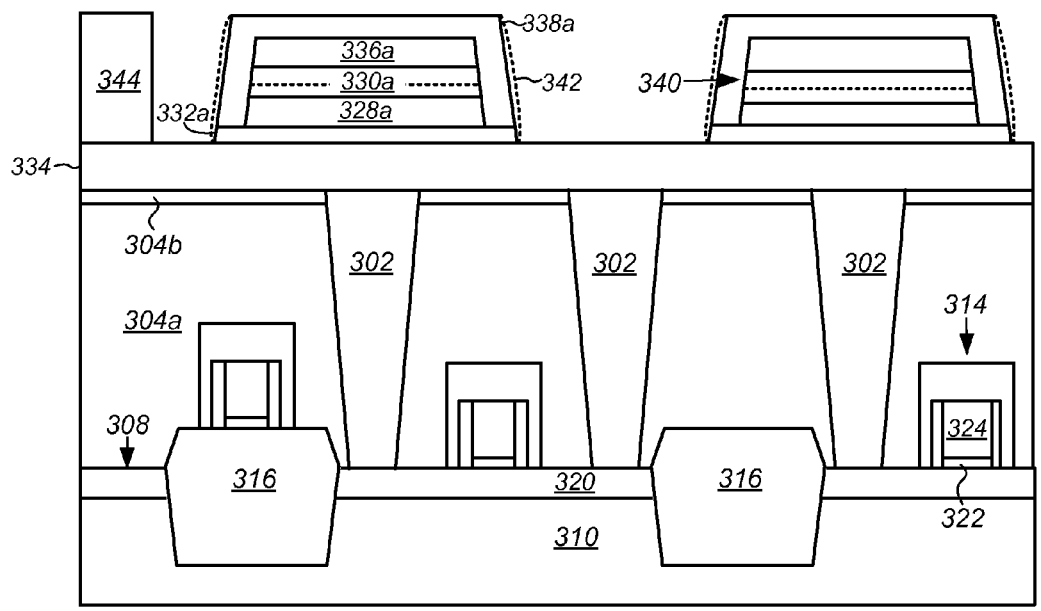
Figure 3G:
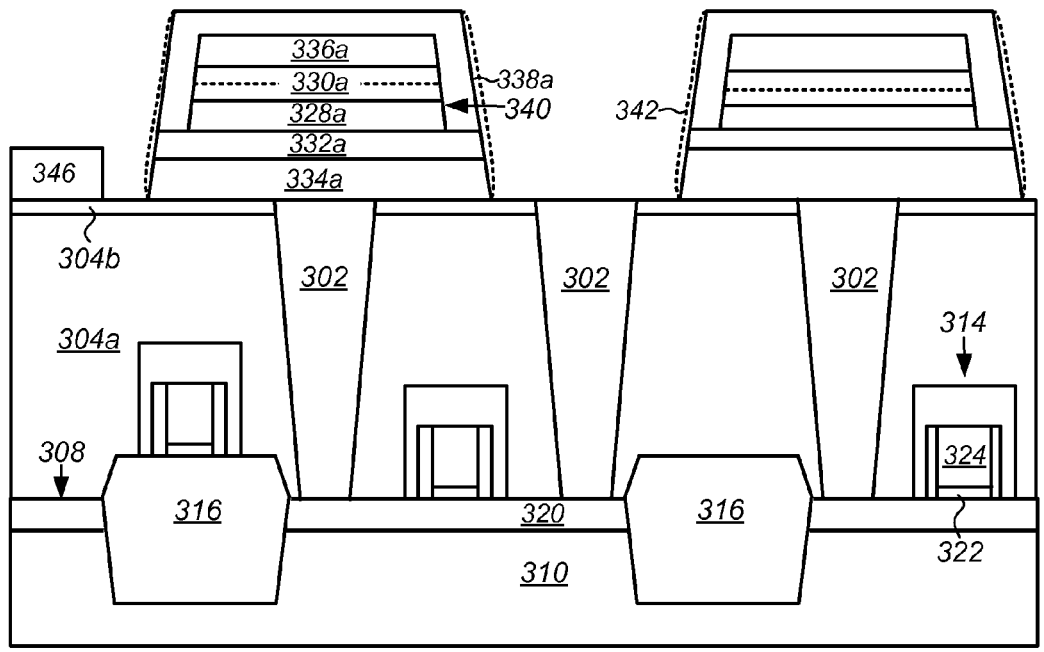

Referring to FIGS. 2 and 3D a non-conductive barrier layer 338 is deposited over the conductive hard-mask 336a, the top electrode 330a and the ferroelectric 328a, as well as exposed portions of the bottom electrode layer 332. Next, a patterned photoresist (PR) mask 341 is formed over the non-conductive barrier layer 338 using standard photolithographic techniques and the non-conductive barrier layer is etched (block 216) to yield a non-conductive barrier 338a on sidewalls 340 of the conductive hard-mask, the top electrode and the ferroelectric, as shown in FIG. 3E. The non-conductive barrier layer 338 can be patterned using the PR mask 341 and standard anisotropic dielectric etching techniques. It will be understood that patterning the non-conductive barrier layer 338 using the PR mask 341 will substantially prevent loss of material during patterning of the non-conductive barrier layer and will advantageously yield a non-conductive barrier 338a that is not removed from a top surface of the conductive hard-mask 336a nor substantially thinned on sidewalls 340 of the conductive hard-mask, the top electrode and the ferroelectric, as shown in FIGS. 3E and 3F.

Generally, the material of the non-conductive barrier 338a is selected to be a dielectric or non-conductive material, compatible with materials used in the conductive hard-mask 336a, the top electrode 330a and the ferroelectric 328a, exhibiting good adhesion, mechanical and thermal properties, and to be resistant to etch chemistries used subsequently to etch the bottom electrode layer 332 and 02 barrier layer 334. Suitable materials include aluminum oxide ($Al_2O_3$), silicon nitride (SiN), silicon oxynitride (SiON), silicon oxide ($SiO_2$) or lead zirconate titanate (PZT). The non-conductive barrier layer 338 can be deposited to an initial thickness of from about 40 to about 80 nm, and is deposited or formed using any suitable deposition method, such as CVD, plasma enhanced CVD (PECVD), or atomic layer deposition (ALD).

Next, referring again to FIG. 2 and FIG. 3F the bottom electrode layer 332 is etched (block 218) to form a bottom electrode 330a as shown. Generally, the bottom electrode layer 332 exposed between the non-conductive barrier 338a is etched through or removed completely by the bottom electrode etch. Conductive residues 342 generated by the bottom electrode etch are re-deposited on the non-conductive barrier 338a and not on the conductive hard-mask 336a or sidewalls 340 of the top electrode 330a and the ferroelectric 328a, thereby electrically isolating the top electrode from by the conductive residues and minimizing or eliminating the possibility of sidewall leakage or shorting of the bottom electrode 332a and top electrode.

Suitable chemistries and techniques for etching the bottom electrode layer 332 are generally the same as for etching the top electrode layer 330, and can include standard metal etch chemistries using wet or dry etching techniques. Because the bottom electrode etch can be the same or similar to the top electrode etch, the non-conductive barrier 338a also protects the top electrode 330a from exposure to the etch chemistry that can damage sidewalls of the top electrode in conventional methods of fabricating ferroelectric capacitors.

Referring again to FIGS. 2, 3F and 3G the $O_2$ barrier layer 334 is etched is etched (block 220) to form an $O_2$ barrier 334a as shown in FIG. 3G. In some embodiments, such as that shown in FIGS. 3F and 3G, the $O_2$ barrier layer 334 is or includes a portion of a local interconnect (LI) layer deposited over the surface 318 of the substrate 310, and etching the $O_2$ barrier layer further includes forming a patterned PR mask 344 over the $O_2$ barrier layer/LI layer 334 and also etching the LI layer to form a LI 346 on the surface of the substrate. Any photoresist remaining on the non-conductive barrier 338a and LI 346 is removed, for example by PR strip or ashing process.

As with the top electrode layer 330 and bottom electrode layer 332, the $O_2$ barrier layer 334 can include standard metal etch chemistries using wet or dry etching techniques. Additionally, as noted above, generally the chemistries and techniques for etching the bottom electrode layer 332 are chosen to be selective to the material of the non-conductive barrier 338a, although some etching or thinning of the non-conductive barrier is acceptable. For example, in one embodiment, in which the non-conductive barrier 338a includes $Al_2O_3$, the bottom electrode layer 332 includes iridium (Ir) and the $O_2$ barrier layer/LI layer 334 includes titanium aluminum nitride (TiAlN), the etch rate ratios of Ir to $Al_2O_3$ and TiAlN to $Al_2O_3$ are 3.5 and 4.6, respectively, using a standard metal etch chemistry. Thus, for a bottom electrode layer 332 having a thickness of about 70 nm Ir and the $O_2$ barrier layer/LI layer 334 having a thickness of about 130 nm TiAlN, an $Al_2O_3$ non-conductive barrier 338a having an initial thickness of about 60 nm on the sidewalls 340 as deposited will have a remaining thickness of greater than or equal to about 12 nm after etching of the bottom electrode layer and the $O_2$ barrier layer/LI layer 334.

Figure 3H:
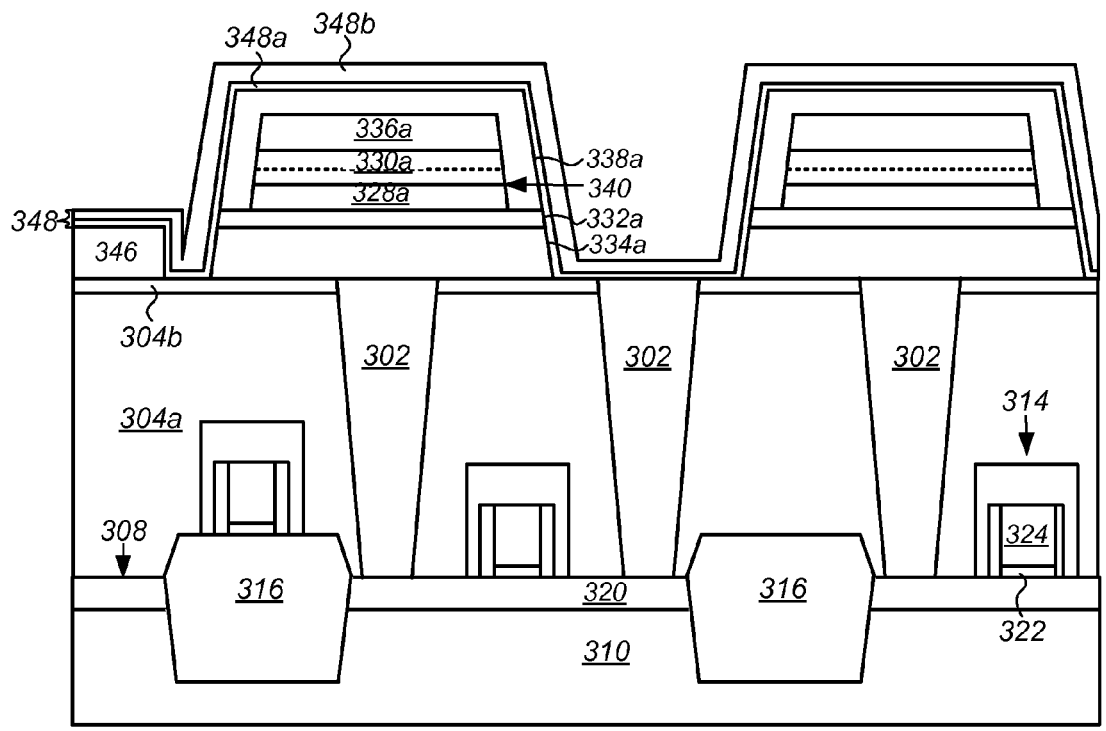

Referring to FIG. 2 and FIG. 3H, after the bottom electrode etch and the LI etch, exposed surfaces of the non-conductive barrier 338a, bottom electrode 332a, $O_2$ barrier 334a, LI 346 and the substrate 310 can be cleaned (block 222). The cleaning can include one or more dry and/or wet cleans each including one or more steps. However, it will be understood that these cleans need not be as aggressive or complicated as those used in in conventional methods of fabricating ferroelectric capacitors, since the risk of sidewall leakage or shorting of the top electrode 330a and bottom electrode 332a due to conductive residues depositing on sidewalls thereof has been eliminated by the non-conductive barrier 338a. Furthermore, it will be appreciated that even if the cleans are aggressive risk of damage to the ferroelectric is minimized by the presence of the non-conductive barrier 338a.

Next, referring to FIG. 2 and FIG. 3H, a hydrogen ($H_2$) barrier 348 is formed over the non-conductive barrier 338a, sidewalls of the bottom electrode 332a $O_2$ barrier 334a, LI 346 and the substrate 310 substantially encapsulating the ferroelectric capacitor (block 224). It will be understood that steps or blocks of the method illustrated in FIG. 2 are inclusive and not comprehensive. Thus, a number of additional processing steps in the forming of the ferroelectric capacitors and/or the associated MOS transistors 314 may be performed between the forming of the non-conductive barrier 338a and the $H_2$ barrier 348 without departing from the scope of the present disclosure.

It has been observed that when a ferroelectric capacitor is exposed to hydrogen introduced, for example during subsequent processing, the properties of the ferroelectric capacitor can be severely degraded. In addition, diffusion of lead (Pb) out from the ferroelectric 328a of the ferroelectric capacitor can adversely impact other elements of the ferroelectric capacitor or MOS transistors 314 or devices integrally formed therewith. The $H_2$ barrier 348 can include a single layer of material, or multiple layers. In one embodiment, such as that shown, the $H_2$ barrier 348 can be a multi-layer $H_2$ barrier to block diffusion of hydrogen into and lead out of the ferroelectric capacitor, including a lower or first barrier layer 348a of aluminum oxide ($Al_2O_3$) having a thickness of from about 100 to about 300 Å, and deposited by ALD, and an upper or second barrier layer 348b of silicon nitride (SiN) having a thickness of from about 0.02 to about 0.10 µm, and deposited by CVD or ALD.

Figure 3I:
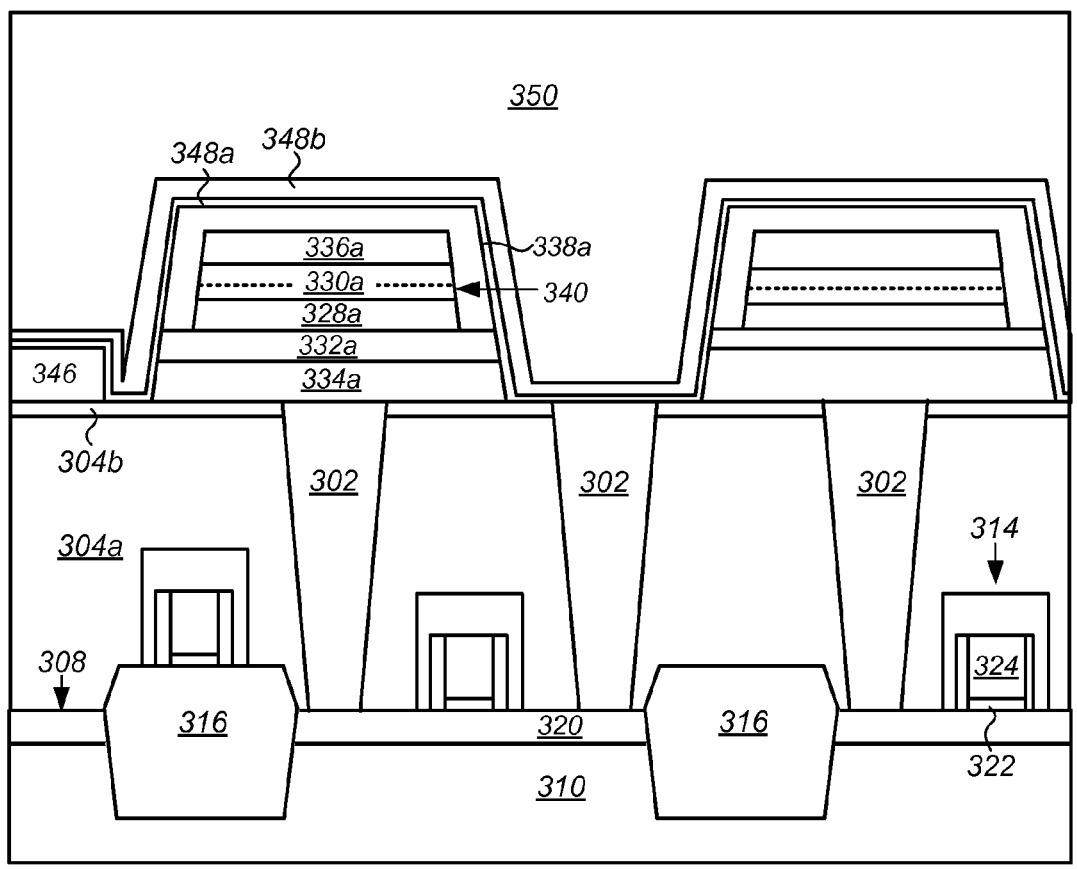
Figure 3J:
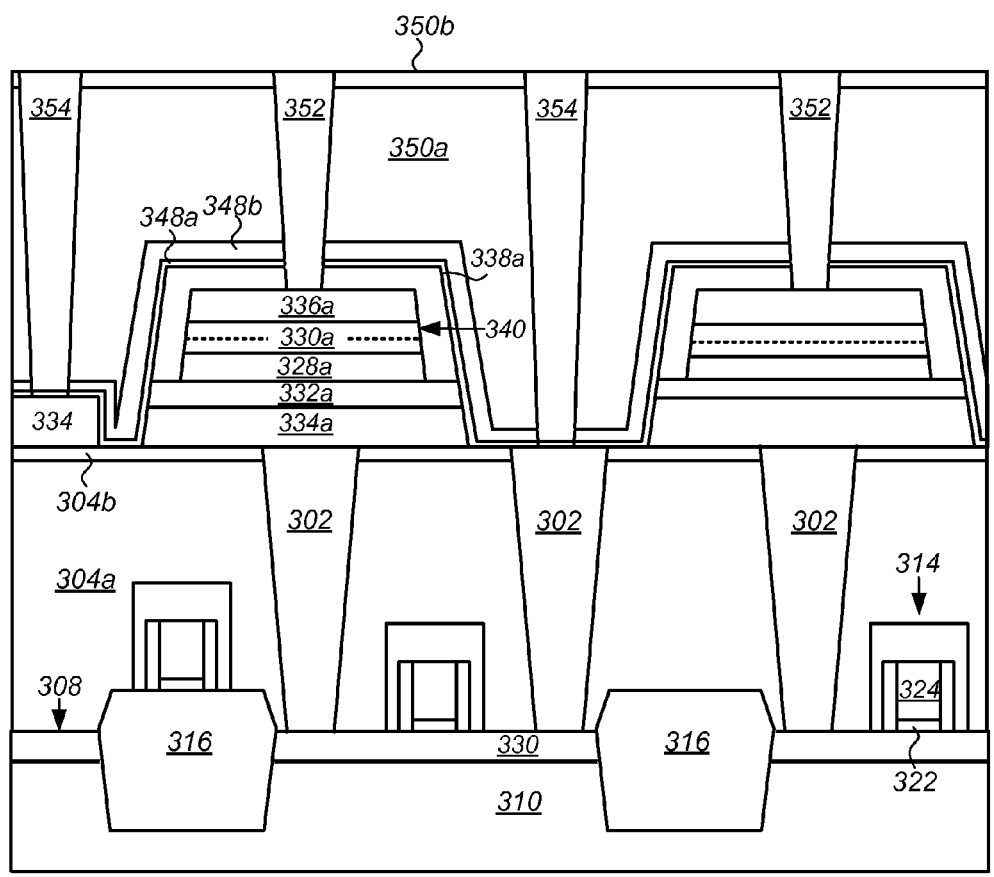
FIG. 3J is a block diagram illustrating a cross-sectional views of a portion of an F-RAM cell fabricated according to the method of FIG. 2.

Referring to FIGS. 2, 3I and FIG. 3J, fabrication of the ferroelectric capacitor is finished (block 226) with process steps including depositing and planarizing an inter-level dielectric (ILD) layer 350 over the $H_2$ barrier 348, as shown in FIG. 3I, and etching and filling openings through the ILD layer and $H_2$ barrier to form second or top electrode contacts 352 electrically coupling to the top electrode 330a through the conductive hard-mask 336a, and third contacts 354 or to any exposed first contact 302, as shown in FIG. 3J.

As with the inter-metal or first dielectric layer 304 described above the ILD layer 350 can include a single layer of dielectric material or multiple layers of dielectric material. For example, as in the embodiment shown the ILD layer 350 can include a lower or bottom ILD layer 350a including phosphosilicate glass (PSG) formed or deposited by a chemical vapor deposition (CVD) process, such as plasma, low pressure or atmospheric CVD, and an upper or top ILD layer 350b including a silicon oxide, deposited by low pressure CVD (LPCVD) tool using tetraethyl-orthosilicate (TEOS) based process gas or precursors. In one embodiment the ILD layer 350 can include a $SiO_2$ having a thickness of from about 0.60 to about 0.80 µm, by deposited by LPCVD using TEOS.

Once formed the surface of the ILD layer 350 is planarized using, for example, a CMP process, and openings for second or top electrode contacts 352 and third contacts 354 etched through the ILD layer and $H_2$ barrier 348 using standard photolithographic and contact etching techniques. For an $SiO_2$ ILD layer 350 suitable contact etching techniques can include forming a patterned photoresist layer, and etching the ILD layer with an etch chemistry comprising carbon-monoxide (CO), argon (Ar), octafluorocyclobutane ($C_4F_8$) or Freon® 318, and, optionally, nitrogen ($N_2$).

Next, referring to FIG. 3J ferro contact openings are filled to form second or top electrode contacts 352 and third contacts 354. As with the first contacts 302 described above, the second and third contacts 352, 354, are formed by filling the contact openings with a refractory metal, such as titanium (Ti), tantalum (Ta), tungsten (W), and nitrides or alloys thereof, by physical vapor deposition, such as sputtering, evaporation or CVD. After filling the first contact openings the contacts are planarized using, for example, a CMP process.

Figure 4:
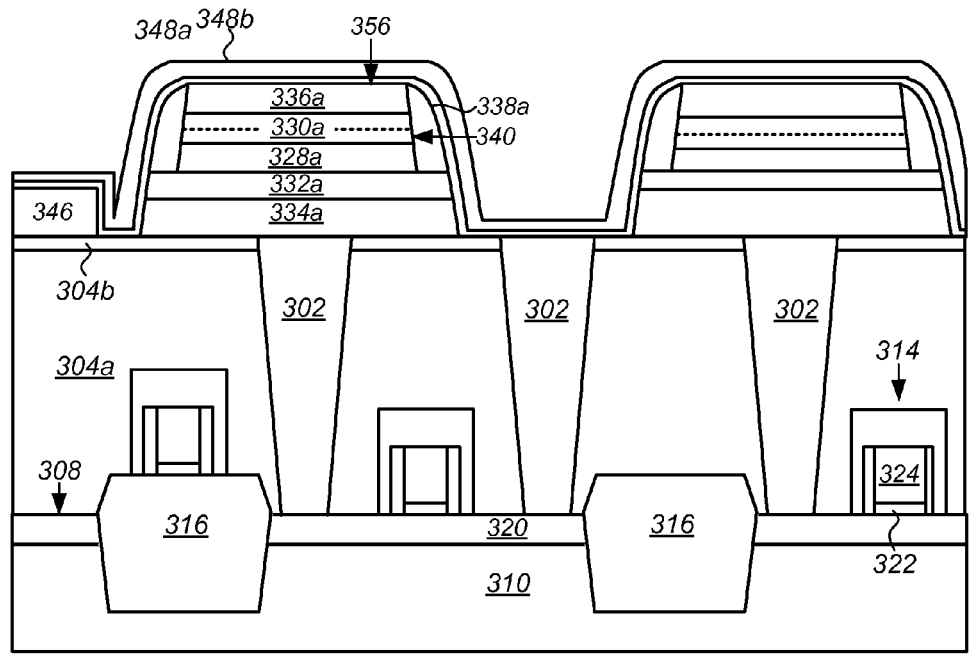
FIG. 4 is a block diagrams illustrating cross-sectional views of ferroelectric capacitors in a portion of an F-RAM cell during fabrication thereof according to an alternative method.

Another embodiment of a method for fabricating a ferroelectric capacitor including a non-conductive barrier 338a covering sidewalls 340 of the top electrode 330a and the ferroelectric 328a of the capacitor will now be described with reference to FIG. 4. The method of fabricating the embodiment of FIG. 4 differs from that described above with respect to FIGS. 2 and 3A-3J, in that after deposition of the non-conductive barrier layer 338 (Block 216) and prior to $H_2$ barrier deposition (Block 224), the non-conductive barrier layer is patterned to form the non-conductive barrier 338a using a global etch back process, that is without forming the PR mask 341 shown in FIGS. 3E and 3F, resulting in thinning of the non-conductive barrier covering the sidewalls 340 of the top electrode 330a and the ferroelectric 328a and substantially completely removing the non-conductive barrier layer 338 from a top surface 356 of the conductive hard-mask 336a and the $O_2$ barrier 334a.

Figure 5:
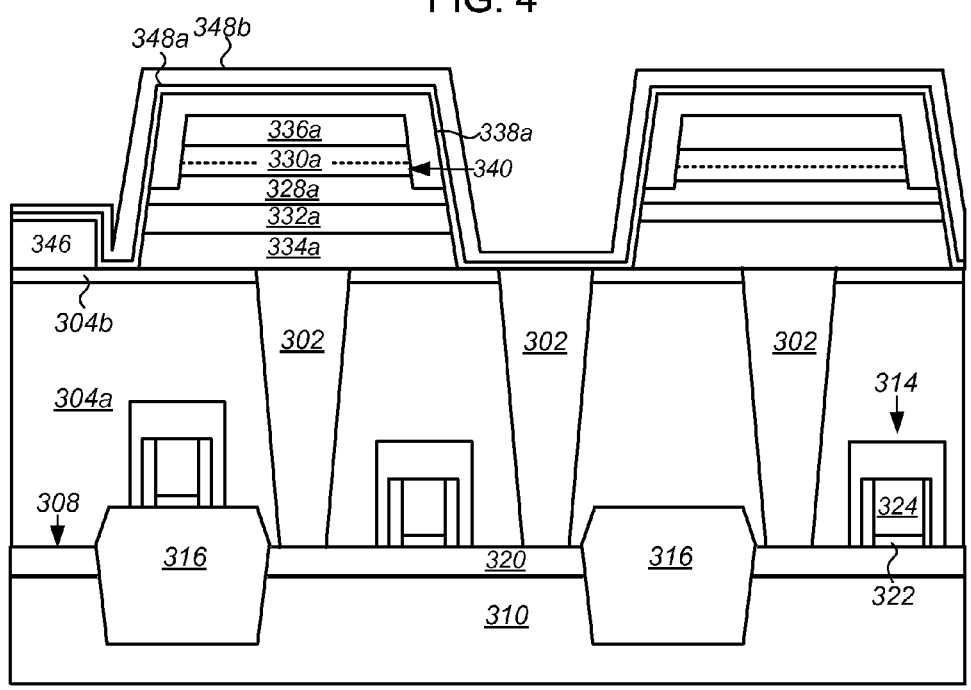
FIG. 5 is a block diagram illustrating a cross-sectional view of ferroelectric capacitors in a portion of an F-RAM cell during fabrication thereof according to another method.

Yet another embodiment of a method for fabricating a ferroelectric capacitor including a non-conductive barrier 338a will now be described with reference to FIG. 5. The method of fabricating the embodiment of FIG. 5 differs from that described above with respect to FIGS. 2 and 3A-3J, in that the non-conductive barrier layer 338 is deposited immediately after the top electrode etch (Block 212) and prior to the ferroelectric etch (Block 214). Because the top electrode etch substantially stops on the ferroelectric layer 328 with only a slight over etch into the ferroelectric layer, the non-conductive barrier 338a formed by the subsequent deposition and patterning of the non-conductive barrier layer 338 covers substantially all of the sidewall of the top electrode 330a, but only a portion of the sidewall of the ferroelectric 328a proportionate to the amount of over-etch into the ferroelectric layer 328. Generally, the over-etch is from about 10-15 nm into the ferroelectric layer 328.

Figure 6:
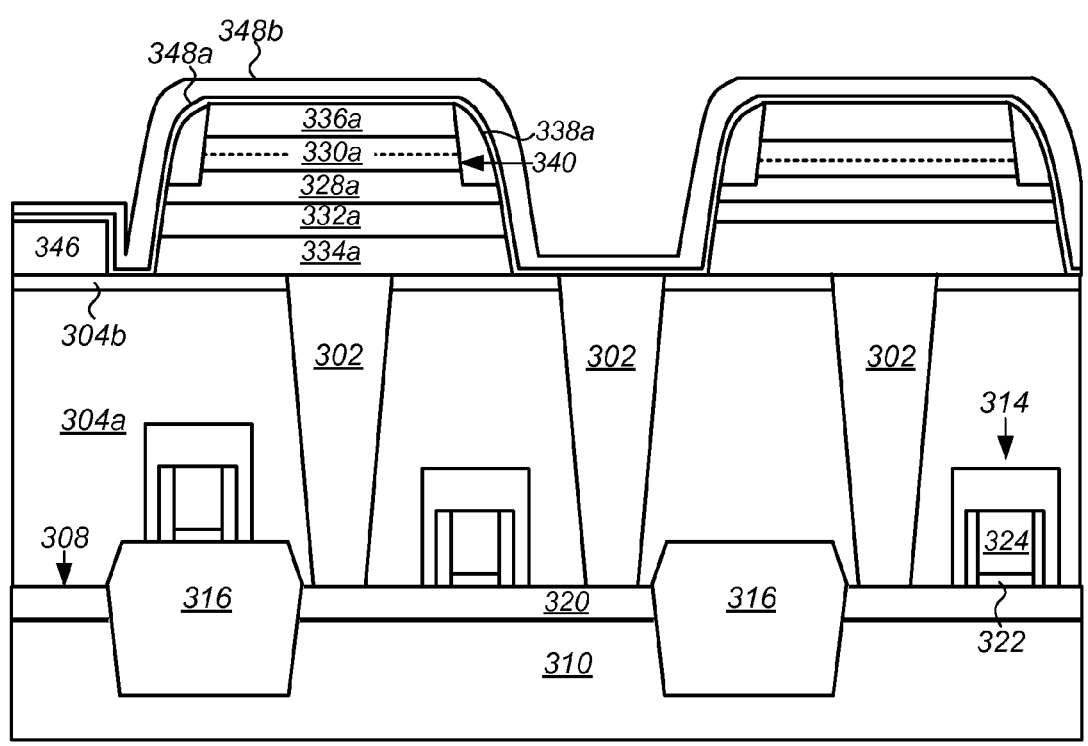
FIG. 6 is a block diagram illustrating a cross-sectional view of ferroelectric capacitors in a portion of an F-RAM cell during fabrication thereof according to yet another method.

Still another embodiment of a method for fabricating a ferroelectric capacitor including a non-conductive barrier 338a will now be described with reference to FIG. 6. The method of fabricating the embodiment of FIG. 6 combines the methods of FIGS. 4 and 5, and differs from that described above with respect to FIGS. 2 and 3A-3J. The method differs firstly in that the non-conductive barrier layer 338 is deposited immediately after the top electrode etch (Block 212) and prior to the ferroelectric etch (Block 214) with only a slight over-etch into the ferroelectric layer 328, and secondly in that after deposition of the non-conductive barrier layer 338 (Block 216) and prior to $H_2$ barrier deposition (Block 224), the non-conductive barrier layer covering the sidewalls 340 of the top electrode 330a and the ferroelectric 328a is thinned and substantially completely removed from a top surface 356 of the $O_2$ barrier 334a. Because the top electrode etch substantially stops on the ferroelectric layer 328 with only a slight over etch into the ferroelectric layer, the non-conductive barrier 338a covers substantially all of the sidewall of the top electrode 330a, but only a portion of the sidewall of the ferroelectric 328a. Additionally, the non-conductive barrier layer 338 covering the sidewalls 340 is thinned and substantially completely removed from the top surface 356 of the conductive hard-mask 336a and the $O_2$ barrier 334a by global etch back as described above.

Thus, embodiments of ferroelectric random access memories (F-RAM) including ferroelectric capacitors and methods of fabricating the same to reduce or eliminate leakage in the ferroelectric capacitors due to conductive residue deposited on sidewalls of the ferroelectric capacitors have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. §1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

What is claimed is:

1. A method comprising:
depositing a ferro stack over a surface of a substrate, the ferro stack including a bottom electrode layer electrically coupled to a bottom electrode contact extending through the substrate, a top electrode layer and ferroelectric layer there between;
forming a hard-mask over the ferro stack;
forming a ferroelectric capacitor, wherein forming the ferroelectric capacitor comprises:
etching through the top electrode layer and at least partially through the ferroelectric layer to form a top electrode;
forming a non-conductive barrier deposited directly on a top surface and sidewalls of the ferroelectric capacitor formed by etching through the top electrode layer and at least partially through the ferroelectric layer;
forming a first patterned photoresist over a portion of the non-conductive barrier located on the top surface of the ferroelectric capacitor and not the sidewalls;
etching the non-conductive barrier using the first patterned photoresist to expose a surface of a bottom electrode layer; and
forming a bottom electrode, wherein forming the bottom electrode comprises etching the bottom electrode layer using the non-conductive barrier as a mask, and wherein conductive residues generated by the etching of the bottom electrode layer are electrically isolated from the top electrode by the non-conductive barrier that covers the sidewalls and the top surface of the ferroelectric capacitor,
wherein the ferro stack further comprises a conductive oxygen ($O_2$) barrier layer deposited on the surface of the substrate between the substrate and the bottom electrode layer, and further comprises etching the conductive $O_2$ barrier layer to form an $O_2$ barrier, wherein the bottom electrode is electrically coupled to the bottom electrode contact through the $O_2$ barrier, and wherein a thickness of the non-conductive barrier on the sidewalls of the ferroelectric capacitor is reduced while etching the bottom electrode layer and the conductive $O_2$ barrier layer.

2. The method of claim 1 further comprising encapsulating the ferroelectric capacitor with a hydrogen ($H_2$) barrier.

3. The method of claim 2 wherein the $H_2$ barrier comprises a multi-layer $H_2$ barrier.

4. The method of claim 1 wherein the etching the conductive $O_2$ barrier layer further comprises forming a local interconnect on the surface of the substrate.

5. The method of claim 1 wherein the non-conductive barrier comprises lead zirconate titanate (PZT).

6. The method of claim 1 wherein the bottom electrode is electrically coupled through the $O_2$ barrier to a bottom electrode contact extending through the substrate.

7. The method of claim 1 wherein etching the bottom electrode layer comprises etching the bottom electrode layer with an etch chemistry highly selective to a material of the non-conductive barrier.

8. The method of claim 1 wherein the bottom electrode layer comprises iridium (Ir).

9. The method of claim 1 wherein the conductive $O_2$ barrier layer comprises titanium aluminum nitride (TiAlN).

* * * * *